US011176657B2

(12) United States Patent
Kito (10) Patent No.: US 11,176,657 B2
(45) Date of Patent: Nov. 16, 2021

(54) INFORMATION PROCESSING DEVICE, MOUNTING DEVICE, AND INFORMATION PROCESSING METHOD (71) Applicant: FUJI CORPORATION, Chiryu (JP)

(72) Inventor: Shuichiro Kito, Toyota (JP)

(73) Assignee: FUJI CORPORATION, Chiryu (JP)

(*) Notice: Subject to any disclaimer, the term of this patent is extended or adjusted under 35 U.S.C. 154(b) by 159 days.

(21) Appl. No.: 16/496,228

(22) PCT Filed: Mar. 29, 2017

(86) PCT No.: PCT/JP2017/013079
§ 371 (c)(1),
(2) Date: Sep. 20, 2019

(87) PCT Pub. No.: WO2018/179187
PCT Pub. Date: Oct. 4, 2018

(65) Prior Publication Data
US 2020/0250809 A1    Aug. 6, 2020

(51) Int. Cl.
G06T 7/00      (2017.01)
G06T 7/12      (2017.01)
G01B 11/02     (2006.01)

(52) U.S. Cl.
CPC .......... G06T 7/0004 (2013.01); G01B 11/028 (2013.01); G06T 7/12 (2017.01); G06T 2207/30148 (2013.01)

(58) Field of Classification Search
CPC .............. G01B 11/028; H05K 13/0813; G06T 2207/30148; G06T 7/0004; G06T 7/12; G06T 7/136
See application file for complete search history.

(56) References Cited

U.S. PATENT DOCUMENTS

2010/0091626 A1    4/2010  Kubo
2015/0339805 A1   11/2015  Ohba et al.
2019/0133010 A1*   5/2019  Sakurayama ...... H05K 13/0812

FOREIGN PATENT DOCUMENTS

| CN | 104885125 A | 9/2015 |
|---|---|---|
| JP | 10-213417 A | 8/1998 |
| JP | 3620884 B2 | 2/2005 |
| JP | 2010-92560 A | 4/2010 |
| JP | 2012-33224 A | 2/2012 |
| JP | 2014-86687 A | 5/2014 |
| JP | 2016-96174 A | 5/2016 |

OTHER PUBLICATIONS

International Search Report dated Jun. 20, 2017 in PCT/JP2017/013079 filed Mar. 29, 2017.

* cited by examiner

Primary Examiner — Bobbak Safaipour
(74) Attorney, Agent, or Firm — Oblon, McClelland, Maier & Neustadt, L.L.P.

(57) ABSTRACT

An information processing device used in a mounting device including a mounting head for collecting components and arranging the components on a board. The imaging processing device includes a control section configured to acquire an image of a member having a straight line side, detect multiple edge points with respect to the straight line side to obtain a proximal straight line of the side, and perform detection processing for detecting the outer shape of the member by excluding edge points outside a predetermined range from the proximal straight line on the outside and inside of the member.

7 Claims, 5 Drawing Sheets

Excluded quantity: First quantity → reporting processing

FIG. 5C

Excluded quantity: Second quantity → excluding processing

INFORMATION PROCESSING DEVICE, MOUNTING DEVICE, AND INFORMATION PROCESSING METHOD

TECHNICAL FIELD

The present disclosure relates to an information processing device, a mounting device, and an information processing method.

BACKGROUND ART

Conventionally, as a mounting device, for example, a device has been proposed in which a boundary between a top surface and a side surface of an IC package is detected by a histogram, linearity of a continuous distribution of each dot is detected from a differential value of a boundary point, and whether a component is damaged is detected by whether dots are applied to four package damage detection windows arranged inside four sides of the IC package (see, for example, patent literature 1). With this device, for example, the position can be accurately detected without being affected by damage on the IC package.

CITATION LIST

Patent Literature

Patent literature 1: JP-A-H10-213417

BRIEF SUMMARY OF INVENTION

Technical Problem

However, in the device of patent literature 1 described above, the package damage detection window is disposed only inside the component, and no particular attention has been paid except to damage of the IC package. For this reason, with this mounting device, it is desirable to detect the outer shape of a member with higher accuracy.

It is an object of the present disclosure to provide an information processing device, a mounting device, and an information processing method capable of detecting an outer shape of a member having a straight side on an outer circumference with higher accuracy.

Solution to Problem

The information processing device, the mounting device, and the information processing method disclosed in this specification adopt the following means in order to achieve the main object described above.

An information processing device of the present disclosure is for use in a mounting device including a mounting head for collecting components and arranging the components on a board, the information processing device including: a control section configured to perform detection processing of acquiring a captured image of a member having a straight line side, detecting multiple edge points with respect to the straight line side to obtain a proximal straight line of the side, and detecting an outer shape of the member by excluding edge points outside a predetermined range from the proximal straight line on an outside and an inside of the member.

With this device, an image of a member having a straight line side is acquired, multiple edge points are detected with respect to the straight line side to obtain a proximal straight line of the side, and detection processing for detecting the outer shape of the member is performed by excluding edge points outside a predetermined range from the proximal straight line on the outside and inside of the member. As described above, since the outer shape is detected by excluding inappropriate edge points on the inside or the outside of the member, the outer shape of the member having a straight side on the outer circumference can be detected with higher accuracy.

DESCRIPTION OF EMBODIMENTS

Figure 1:
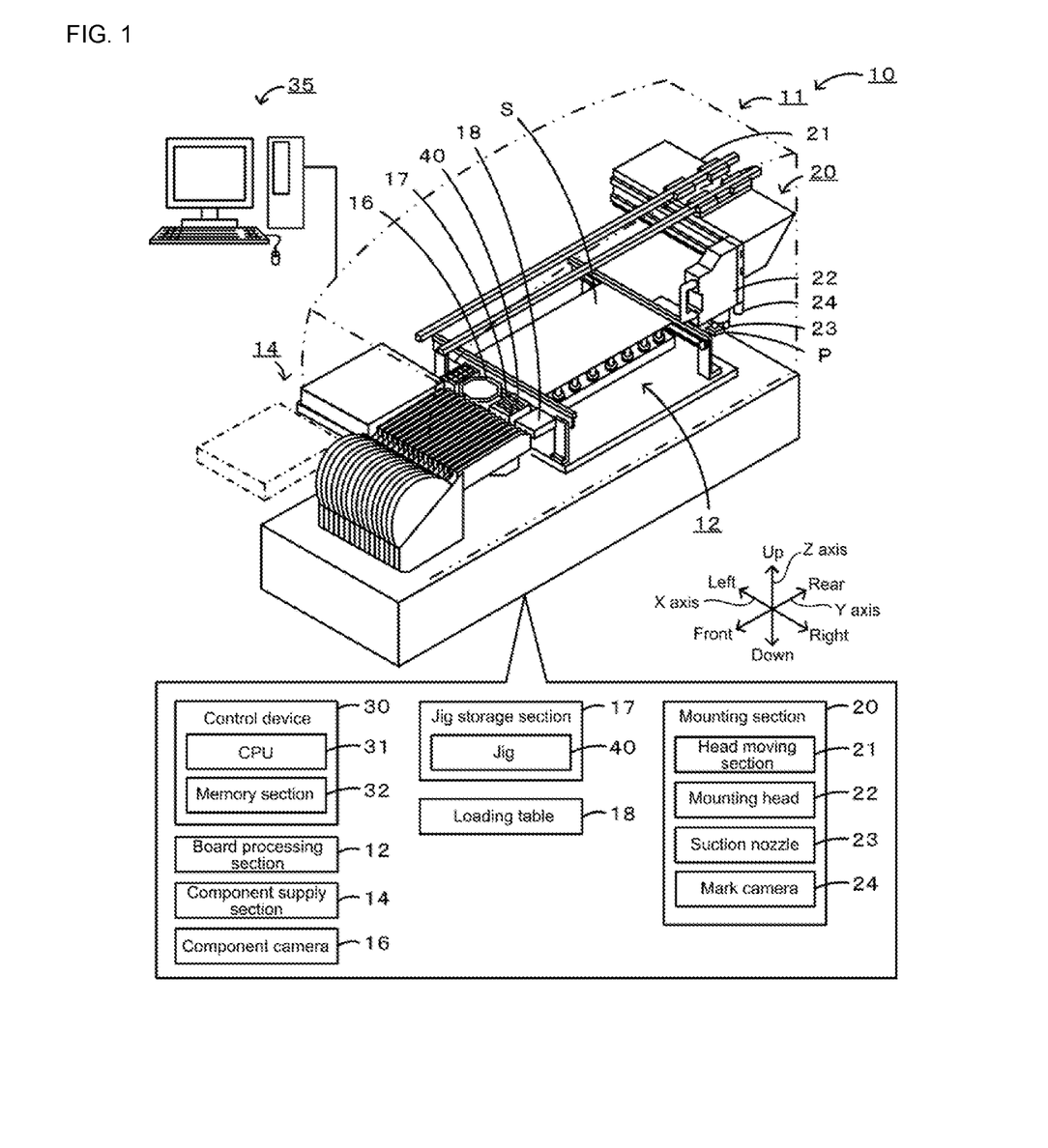
FIG. 1 is a schematic view showing an example of a mounting system 10.
Figure 2:
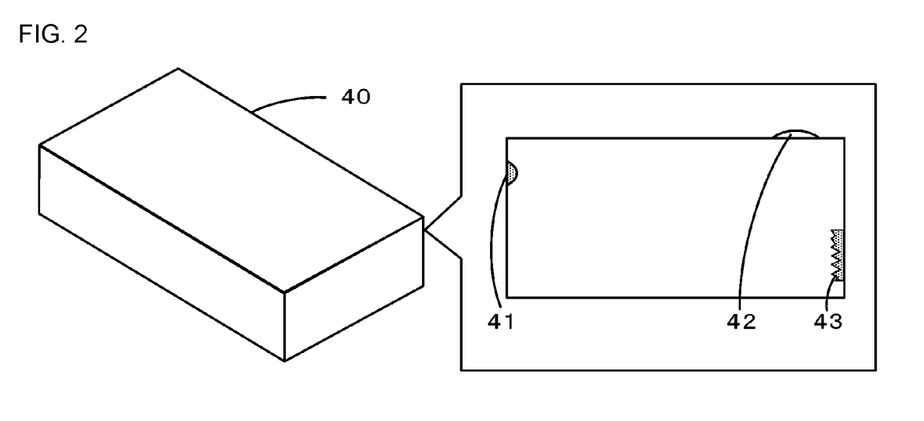
FIG. 2 shows an example of jig 40 for accuracy measurement.

The present embodiment will be described below with reference to the drawings. FIG. 1 is a schematic view showing an example of mounting system 10. FIG. 2 shows an example of an accuracy measurement jig (hereinafter referred to as jig 40). Mounting system 10, for example, performs mounting processing for mounting components P on board S. Mounting system 10 is provided with mounting device 11 and management computer (PC) 35. Mounting system 10 is configured as a mounting line in which multiple mounting devices 11 are arranged from upstream to downstream. For ease of understanding, FIG. 1 only shows one mounting device 11. In the present embodiment, left-right directions (X axis), front-rear directions (Y axis), and up-down directions (Z axis) are set as shown in FIG. 1.

As shown in FIG. 1, mounting device 11 is provided with board processing section 12, component supply section 14, component camera 16, jig storage section 17, loading table 18, mounting section 20, and control device 30. Board processing section 12 loads board S, conveys board S, fixes board S at a mounting position, and unloads board S. Board processing section 12 includes a pair of conveyor belts provided extending in a left-right direction and separated in the front-rear direction of FIG. 1. Board S is conveyed by these conveyor belts.

Component supply section 14 includes multiple feeders each having a reel or a tray unit, and is detachably attached to the front side of mounting device 11. Tape is wound on each reel and multiple components P are held in the surface of the tape in a lengthwise direction. The tape is unwound to the rear from the reel, and with a component exposed, is fed by a feeder section to a pickup position at which the component is picked up by suction nozzle 23. A tray unit has a tray on which multiple components are arranged, and moves the tray into and out of a predetermined collecting position.

Component camera 16 (first imaging section) is a device for capturing an image, and is a unit for capturing one or more components P picked up and held by mounting head 22. Component camera 16 is disposed between component supply unit 14 and board processing unit 12. The imaging range of component camera 16 is above component camera 16. When mounting head 22 holding component P passes over component camera 16, component camera 16 captures an image thereof, and outputs captured image data to control device 30.

Jig storage section 17 stores and keeps one or more jigs 40. Jig 40 is a member for calibrating a positional deviation and a rotational angle deviation of a component P collected by mounting head 22. As shown in FIG. 2, jig 40 is a rectangular parallelepiped-shaped member having straight sides and linearity of an external shape that is extremely high compared with an ordinary component. Jig 40 is made of a material the volume of which does not change easily, such as ceramic. Loading table 18 is a table on which jig 40 collected by mounting section 20 is loaded. During the calibration process, mounting device 11 detects a pickup deviation (position and rotation angle) based on the captured image obtained by collecting jig 40 using suction nozzle 23, detecting a positional deviation (position and rotation angle) based on the captured image obtained by loading jig 40 on loading table 18, and obtains a calibration value for which these deviations become smaller.

Mounting section 20 collects component P from component supply section 14 and arranges component P on board S fixed by board processing section 12. Mounting section 20 is provided with head moving section 21, mounting head 22, and suction nozzle 23. Head moving section 21 is provided with sliders that move in XY directions guided by guide rails and motors that drive the sliders. Mounting head 22 is removably attached to a slider and is movable in the XY directions by head moving section 21. At least one (for example, sixteen, eight, or more) suction nozzle 23 is detachably mounted on a lower surface of mounting head 22 such that multiple components P can be collected at a time. Suction nozzle 23 is a pickup member for picking up a component using negative pressure.

Mark camera 24 is arranged on a lower surface of mounting head 22 (or slider). Mark camera 24 is, for example, an imaging device capable of capturing an image of board S, component P, jig 40, and the like from above. Mark camera 24 moves in the XY directions with the movement of mounting head 22. Mark camera 24 captures an image of a reference mark on board S used to grasp the position of board S, and outputs the captured image to control device 30.

As shown in FIG. 1, control device 30 is configured as a microprocessor centered around CPU 31, and includes memory section 32 for storing various data. Control device 30 outputs control signals to board processing section 12, component supply section 14, component camera 16, and mounting section 20, and receives signals from mounting section 20, component supply section 14, and component camera 16. Memory section 32 stores mounting condition information including the mounting order in which the components P are mounted on board S, arrangement positions of components P, types of suction nozzle 23 by which components P can be collected, and the like.

Management PC 35 manages information of each device of mounting system 10. Management PC 35 includes a control unit, a memory section, a display, and an input device. The control unit is configured as a microprocessor configured around a CPU. The memory section is a device for storing various data such as a processing program, for example, an HDD. The display is a liquid crystal screen for displaying various types of information. The input device includes a keyboard, a mouse, and the like through which an operator inputs various commands. The memory section stores mounting condition information and the like.

Next, operation of mounting system 10 of the present embodiment as configured above is described, with mounting processing of mounting device 11 being described first. When mounting processing is started, CPU 31 first reads the mounting condition information and executes the calibration process. This processing will be described in detail later. Next, CPU 31 causes board processing section 12 to convey and fix board S. Here, mark camera 24 captures an image of a reference mark formed on board S, and detects the fixed position of board S, the deflection of board S, and the like. Next, CPU 31 performs a process to cause components P to be picked up by suction nozzles 23 based on the arrangement order set in the mounting condition information, and for the components P to be arranged at the set arrangement positions. Here, CPU 31 controls head moving section 21 such that mounting head 22 passes over component camera 16. Further, CPU 31 causes component camera 16 to image the components P picked up by suction nozzles 23. CPU 31 corrects the deviation of the pickup position and the deviation of the rotational angle of the components P by using the captured image, and arranges the components P on board S such that the components P are positioned at an appropriate position and orientation. The CPU 31 repeats such processing for all boards S. Note that CPU 31 may perform the calibration processing during mounting processing in some cases, considering thermal expansion of members due to continuous operation and the like.

Figure 3:
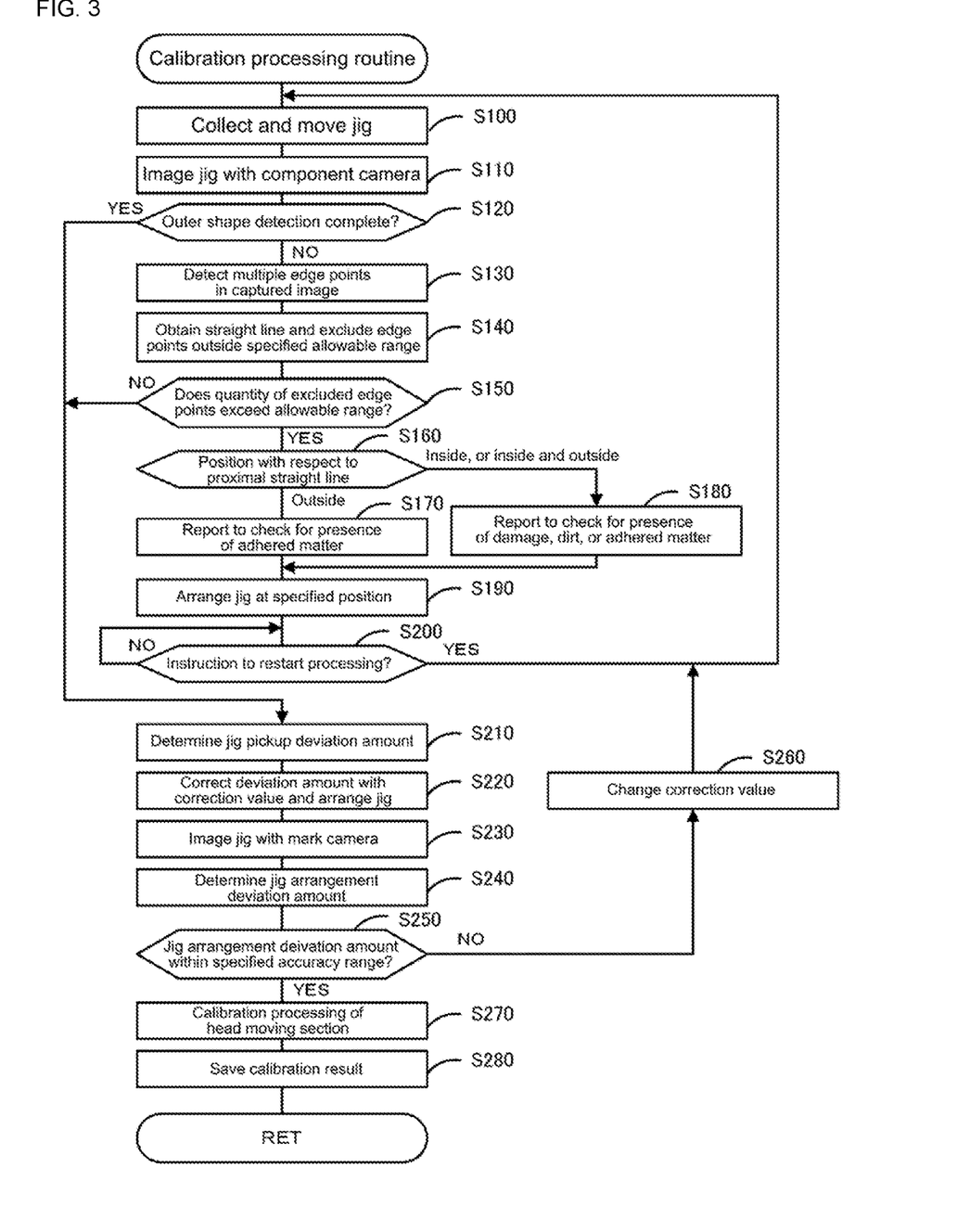
FIG. 3 is a flowchart showing an example of a calibration processing routine.
Figure 4A:
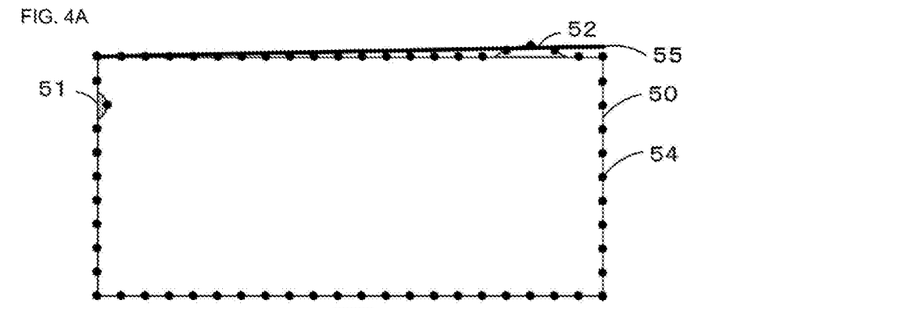
FIG. 4 illustrates detection of the outer shape of jig 40 excluding excluded edge points.
Figure 4B:
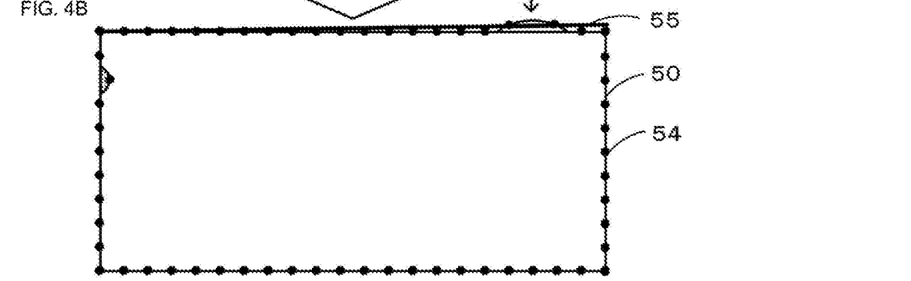
Figure 4C:
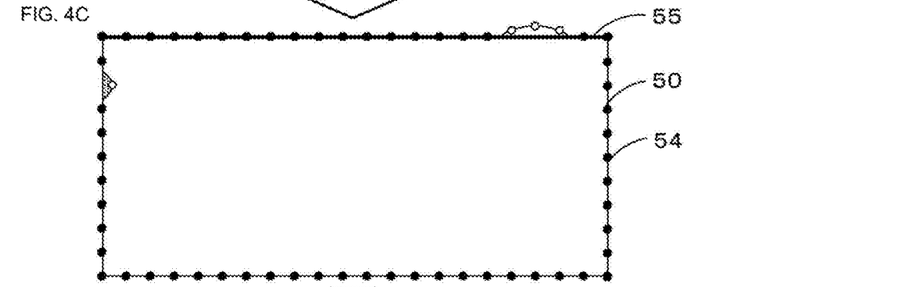
Figure 4D:
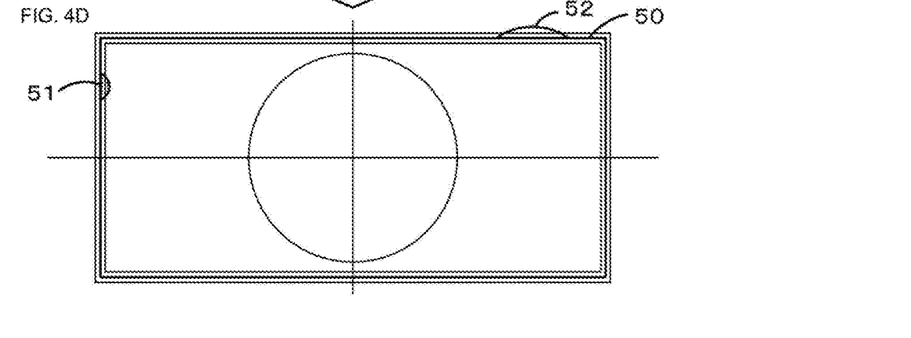

Next, calibration processing with mounting device 11 will be described. FIG. 3 is a flowchart showing an example of a calibration processing routine performed by CPU 31 of control device 30. This routine is stored in memory section 32, and is executed when a predetermined calibration execution timing is reached. The calibration execution timing may be set, for example, for when the device is started, or when the device is continuously operated for a predetermined period of time (for example, two hours, four hours, or the like). When this routine is started, CPU 31 first causes suction nozzle 23 that is a target for calibration to collect jig 40, move the jig 40 above component camera 16 (S100), and causes component camera 16 to image the jig 40 (S110). Next, CPU 31 determines whether the outer shape of the jig 40 has been detected (S120). The outer shape detection is, for example, as shown in FIG. 2, a process of determining whether the jig 40 has damage 41, adhered matter 42, dirt 43, or the like. If the external shape of the collected jig 40 has not been detected, CPU 31 executes detection processing of detecting the outer shape of the jig 40 (S130 to S200).

FIG. 4 illustrates an example of detection processing for detecting the outer shape of jig 40 excluding excluded edge points. As shown in FIG. 4, jig image 50 obtained by imaging includes damage image 51, adhered matter image 52, and the like. When this detection processing is executed, first, CPU 31 detects multiple edge points of the jig image included in the captured image (S130, FIG. 4A). Edge points 54 are detected at multiple points (several tens of points) with respect to the outer periphery of jig image 50. Here, it is assumed that CPU 31 detects twenty points on the long side and ten points on the short side of jig 40. The quantity of points for which this edge point is detected may be freely determined so as to obtain linearity. Next, CPU 31 obtains proximal straight line 55 based on the detected edge points, and performs a process of excluding the edge points 54 outside a predetermined range from the proximal straight line 55 (S140). CPU 31 may obtain the proximal straight line 55 by, for example, a minimum squares method or the like. Further, the removal of excluded edge points 54 may be performed until the proximal straight line 55 reaches a required accuracy by using, for example, RANSAC or the minimum-median method (LMedS) (FIG. 4B). The predetermined range is set based on a distance deviated from the proximal straight line closest to the side of the straight line of jig image 50, and is a range between the threshold values set for the inside and outside of jig image 50. Note that, in FIG. 4C, the edge points 54 that have been excluded are shown in white. In this manner, CPU 31, in the end, obtains a proximal straight line by excluding exceptionally deviated points, and uses the proximal straight line as the outer periphery of jig 40.

Having determined the edge points to be excluded, CPU 31 determines whether the quantity of excluded edge points exceeds a specified allowable range (S150). The allowable range may be set to a value, for example, one or five, which can guarantee the calibration accuracy by jig 40. If the quantity of excluded edge points exceeds the allowable range, CPU 31 determines the position of the excluded edge points relative to the proximal straight line (S160). If an excluded edge point is outside proximal straight line 55, CPU 31 determines that there is a possibility of adhered matter on the outer periphery, and informs the operator to confirm the presence or absence of adhered matter on jig 40 (S170). The notification to the operator may be performed by, for example, displaying a message to that effect on the display unit of the operation panel, or by providing voice guidance to that effect. On the other hand, if an excluded edge point is inside proximal straight line 55, or if excluded edge point exists inside and outside, CPU 31 judges that there is a possibility of damage or dirt on the inside, or adhered matter on the outer periphery, and notifies the operator to confirm the presence or absence of such on jig 40 (S180).

Subsequently, CPU 31 arranges jig 40 at a specified position (S190), determines whether there has been an instruction to restart processing based on an instruction input from an operation panel, which is not shown, (S200), and waits if there has not been an instruction to restart processing. Here, CPU 31 may load a jig 40 determined to be inappropriate during outer shape detection processing on mounting table 18. Unlike a component P, jig 40 is repeatedly collected and arranged many times, so that adhered matter such as dust and dirt, or damage may occur. Here, these are detected by the outer shape detection processing and notified to the operator. Upon confirming the content of the above notification, the operator checks the appearance of the jig 40 loaded on loading table 18, removes dirt and adhered matter that can be removed, or removes the jig 40 from use in detection processing if there is damage such that the jig cannot be used. Then, when an instruction to restart processing is received, CPU 31 executes processing from S100. That is, detection processing is executed using the next jig 40.

On the other hand, in S120, if the outer shape of the jig 40 picked up by suction nozzle 23 has already been inspected, or if the quantity of edge points excluded in S150 is within the allowable range, the pickup deviation amount (position and rotational angle) of the jig 40 is obtained based on the image captured by component camera 16 (S210). The pickup position deviation amount may be determined, for example, from the amount that the center of jig 40 deviates in the X axis and Y axis directions from the center of suction nozzle 23. Further, the amount of deviation of the pickup rotation angle may be determined by the extent of an angle with respect to the ideal orientation of jig 40. Upon obtaining the pickup deviation amount, CPU 31 arranges the jig 40 having performed correction using a correction value that corrects for the deviation amount (S220). CPU 31 may cause jig 40 to be loaded on loading table 18. Next, CPU 31 causes mark camera 24 to image the arranged jig 40 from above (S230). Then, CPU 31 obtains the position deviation amount (position and rotational angles) of the jig 40 based on the image captured by mark camera 24 (S240). The position deviation amount may be determined, for example, from the amount that the center of jig 40 deviates in the X axis and Y axis directions from the arrangement target position. Further, the amount of deviation of the arrangement rotation angle may be determined by the extent of an angle with respect to the ideal orientation of the arranged jig 40.

Continuing, CPU 31 determines whether the arrangement deviation amount is within a specified accuracy range (S250). The accuracy range may be a range of a distance or an angle permitted by the arrangement or the like of the component P. If the arrangement deviation amount is not within the specified accuracy range, CPU 31 changes the correction value and executes processing from S100 in order to make the correction value for correcting the pickup deviation more appropriate. The correction value may be changed by, for example, increasing the correction amount when the correction amount of the distance or the angle is insufficient, and decreasing the correction amount when the correction amount is too large. Such processing is repeated to set a more appropriate correction value.

In S250, if the arrangement deviation amount is within the specified accuracy range, CPU 31 terminates the calibration processing of the deviation amount for suction nozzles 23, and performs other calibration processing, for example, calibration processing of head moving section 21 (S270). In this calibration processing, for example, CPU 31 moves mounting head 22, measures the moving distance by a counter, and adjusts the moving distance of mounting head 22 so that mounting head 22 is positioned at an appropriate position based on the length of the moving area (reference distance) and a counter value (actual measurement distance). Note that, CPU 31 may perform other calibration processing, but details thereof are omitted. Then, CPU 31 saves the calibration processing results (S280) and ends the routine. As described above, since an appropriate jig 40 is used for the outer shape detection processing, more accurate calibration processing can be performed.

Next, correspondences between constituent elements of the present embodiment and constituent elements of the disclosure will be clarified. Control device 30 of the present embodiment corresponds to an information processing device of the present disclosure, CPU 31 corresponds to the control section, and jig 40 corresponds to the member and the jig for measuring accuracy. Further, component camera 16 corresponds to a first imaging section, and mark camera 24 corresponds to a second imaging section. Note that, with the present embodiment, an example of an information processing method of the present disclosure is also made clear from the descriptions of operation of control device 30.

With mounting device 11 of an embodiment described above, an image of accuracy measurement jig 40 (member) having a straight line side is acquired, multiple edge points are detected with respect to the straight line side to obtain a proximal straight line of the side, and detection processing for detecting the outer shape of jig 40 is performed by excluding edge points outside a predetermined range from the proximal straight line on the outside and inside of jig 40. With this device, since the outer shape is detected by excluding an inappropriate edge points on the inside or the outside of jig 40, the outer shape of the member having a straight side on the outer circumference can be detected with higher accuracy. In addition, when the quantity of excluded edge points is outside a specified allowable range, control device 30 notifies an operator of confirmation processing of jig 40, so that the operator can be prompted to check the state of the member and to clean or replace jig 40. Further, if the quantity of edge points excluded outside the jig 40 is outside the specified allowable range, control device 30 notifies the operator of confirmation processing of checking for adhered matter on jig 40. With this device, it is possible to notify about checking for adhered matter on the outside of jig 40. Further, if the quantity of edge points excluded inside the jig 40 is outside the specified allowable range, control device 30 notifies the operator of confirmation processing of checking for damage to jig 40 and/or checking for adhered matter on jig 40. With this device, it is possible to notify about checking for damage or adhered matter on the inside of jig 40.

Further, control device 30 acquires a captured image obtained by capturing jig 40 in a state held by mounting head 22, executes detection processing to detect the outer shape of jig 40, and obtains a deviation in the pickup position and/or a deviation in the rotation angle of jig 40 on mounting head 22. With this device, thanks to detecting a more accurate outer shape of jig 40, it is possible to obtain a more accurate position and rotation deviation. Further, since jig 40 is a jig for accuracy measurement, and control device 30 executes detection processing during calibration processing, it is possible to perform calibration processing more accurately by using an accuracy measurement jig and detecting the accurate outer shape thereof.

Furthermore, mounting device 11 is provided with component camera 16 (first imaging section) capable of imaging jig 40 in a state held by mounting head 22, and mark camera 24 (second imaging section) capable of imaging jig 40 after jig 40 has been arranged at a specified position by mounting head 22; jig 40 is an accuracy measurement jig; and control device 30 causes component camera 16 to image jig 40 held by mounting head 22, and executes detection processing using the obtained first pickup image to detect the outer shape of jig 40. Further, control device 30 performs calibration processing in which the deviation of the pickup position and/or the deviation of the rotation angle of jig 40 on mounting head 22 is obtained, the obtained deviation is corrected and jig 40 is arranged at a specified position, and, after being arranged at the specified position, jig 40 is imaged by mark camera 24, and the obtained second image is used to obtain the deviation of the arrangement position and/or the deviation of the rotation angle of jig 40 one or more times. With this device, since accuracy measurement jig 40 is used and an accurate outer shape thereof is detected, it is possible to more accurately confirm the state of the collected jig 40 and the arranged jig 40 to more accurately perform calibration processing.

Meanwhile, it goes without saying that the present disclosure of a management device and mounting related device is not limited to the above-mentioned embodiments and various embodiments may be applied within the technical scope of the disclosure.

For example, in an embodiment described above, CPU 31 notifies an operator of a process of checking jig 40 when the quantity of excluded edge points is outside a specified allowable range, but the configuration is not particularly limited thereto, and this process may be omitted. Here, CPU 31 may memorize jigs 40 for which the quantity of excluded edges is outside the allowable range, and may output that information to management PC 35. With this device, the result of the detection processing of the outer shape of jig 40 can be used later. Alternatively, CPU 31 may perform processing of excluding the jig 40 whose number of excluded edges exceeds an allowable range from the calibration processing. With this device, by detecting a more accurate outer shape, an inappropriate jig 40 can be excluded from calibration processing. Note that, exclusion of an inappropriate jig 40 may mean, for example, prohibiting pickup from jig storage section 17, loading on loading table 18, or putting into a reject box.

In an embodiment described above, CPU 31 notifies an operator of a process of checking for adhered matter on jig 40 when the quantity of excluded edge points outside jig 40 is outside the specified allowable range, but the configuration is not particularly limited to this, and this process may be omitted. Further, in an embodiment described above, when the quantity of excluded edge points inside jig 40 or inside and outside jig 40 is outside the specified allowable range, the process of checking for damage to jig 40 and/or the adhered matter on the jig 40 is notified to the operator, but the configuration is not particularly limited thereto, and this process may be omitted. It is possible to omit the reporting of whether the excluded edge point is inside or outside of jig 40, but it is desirable to perform this reporting.

In an embodiment described above, CPU 31 performs detection processing of detecting the outer shape of jig 40 using captured images of jig 40 held by mounting head 22, but the configuration is not particularly limited thereto. Detection processing of the outer shape of jig 40 may use, for example, an image of jig 40 loaded in jig storage section 17 or on loading table 18 captured by mark camera 24 or the like. Detection processing of the outer shape of jig 40 can be performed with such an image as well.

Figure 5A:
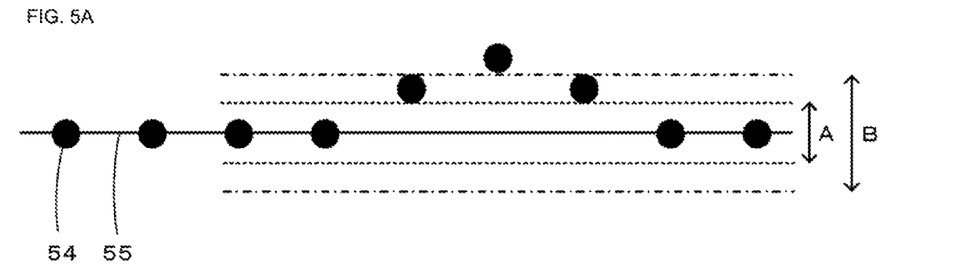
FIG. 5 illustrates providing multiple allowance ranges with respect to edge points 54.
Figure 5B:
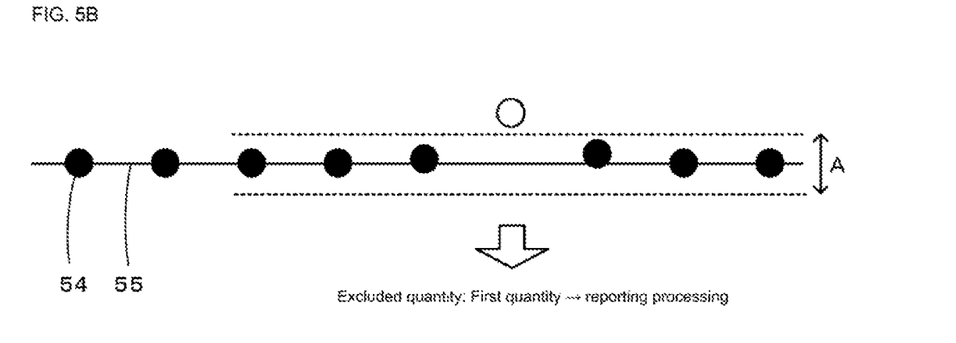
Figure 5C:
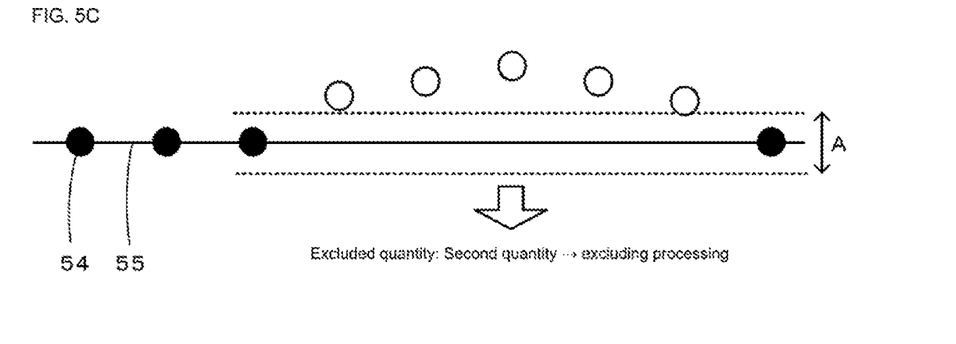

In an embodiment described above, CPU 31 determines that jig 40 is in an inappropriate state when the number of excluded edge points is outside the specified allowable range, but the configuration is not particularly limited thereto, and multiple stages of allowable ranges may be provided and processes may be executed differently for each stage. FIG. 5 illustrates providing multiple allowance ranges with respect to edge points 54. In FIG. 5A, it is assumed that a first allowable range A and a second allowable range B that is a range larger than the allowable range A are set. For example, when a specified first number of edge points 54 exceeds the allowable range A, CPU 31 notifies the operator of the process of checking the jig 40. Further, CPU 31 may exclude jig 40 from use in calibration processing when a specified second number of edge points 54 exceeds allowable range B. Further, as shown in FIGS. 5B and 5C, if allowable range A is fixed and a specified quantity of first edge points 54 that exceed allowable range A are excluded, CPU 31 may inform the operator of the confirmation process of jig 40 and exclude this jig 40 from use in the calibration process if a second quantity of edge points 54 greater than the allowable range A is excluded. Alternatively, multiple allowable ranges and stipulations on the multiple exclusions may be combined.

In an embodiment described above, mounting device 11 performs detection processing of detecting the outer shape of jig 40, but the configuration is not particularly limited to this, and processing may be performed by another device, such as management PC 35, for example, as long as captured images can be acquired. In an embodiment described above, mounting system 10 having mounting device 11 and management PC 35 is described, but only mounting device 11 may be used or only management PC 35 may be used.

In an embodiment described above, detection processing of the outer shape of jig 40 is performed by calibration processing using jig 40 for accuracy measurement, but the configuration is not particularly limited thereto, and detection processing of the external shape may be performed on the component P having a straight line side and used in the mounting processing. In this case too, since the outer shape is detected by excluding inappropriate edge points on the inside or outside of the component P (member), the outer shape of the member having a straight side on the outer circumference can be detected with higher accuracy. Note that, detection processing of the outer shape may be performed on the component P, but it is desirable to use a jig used for calibration processing based on the higher need for measurement accuracy.

In an embodiment described above, the information processing device and the mounting device of the present disclosure have been described as control device 30 and mounting device 11, but the configuration is not particularly limited thereto, and an information processing method may be employed.

Here, in the information processing device of the present disclosure, the control section may notify an operator of the checking processing of the member when the quantity of excluded edge points is outside a specified allowable range. With this device, it is possible to prompt the operator to confirm the state of the member and to clean or replace the member. In the information processing device, when the quantity of excluded edge points on the outside of the member is outside a specified allowable range, the control section may notify the operator of the process of confirming adhered matter on the member. With this device, it is possible to notify for checking for adhered matter on the outside of the member. Further, in the information processing device, when the quantity of excluded edge points on the inside of the member is outside the specified allowable range, the control section may notify the operator of the process of confirming damage to the member and/or the adhered matter on the member. With this device, it is possible to notify about checking for damage or adhered matter on the inside of jig 40.

With this information processing device, the control section may acquire a captured image of the member held by the mounting head, perform detection processing to detect the outer shape of the member, and obtain a deviation of the pickup position and/or a deviation of the rotation angle of the member on the mounting head. With this device, thanks to detecting a more accurate outer shape of the member, it is possible to obtain a more accurate position and rotation deviation.

With this information processing device, the member may be an accuracy measurement jig, and the control section may perform detection processing during calibration processing. With this device, since a jig for accuracy measurement is used and an accurate outer shape thereof is detected, calibration processing can be performed more accurately.

A mounting device according to the disclosure includes a mounting head for collecting components and arranging the components on a board, and an information processing device described above. With this mounting device too, similar to with the above information processing device, since the outer shape is detected by excluding an inappropriate edge points on the inside or the outside of the member, the outer shape of the member having a straight side on the outer circumference can be detected with higher accuracy. Here, the "member" may be a component used in mounting processing, or may be an accuracy measurement jig used in calibration processing, but the latter is more desirable based on the higher need for measurement accuracy.

The control section may be configured to perform a process of excluding the member when the quantity of the excluded edge points is outside a specified allowable range. With this device, by detecting a more accurate outer shape, an inappropriate member can be excluded.

The mounting device may further include: a first imaging section configured to capture an image of the member in a state held by the mounting head; and a second imaging section configured to capture an image of the member after the mounting head has arranged the member at a predetermined position, wherein the member is an accuracy measurement jig, and the control section is configured to perform calibration processing of performing processing at least once to cause the first imaging section to capture an image of the member in a state held by the mounting head, perform the detection processing to detect the outer shape of the member using the obtained first captured image, obtain a deviation of a pickup position and/or the deviation of a rotation angle of the member at the mounting head, correct the obtained deviation, arrange the member at the predetermined position, capture the member after the member has been arranged at the predetermined position using the second image capturing section, and obtain the deviation of the arrangement position and/or the deviation of the rotation angle of the member using the obtained second captured image. With this device, since an accuracy measurement jig is used and an accurate outer shape thereof is detected, it is possible to more accurately confirm the state of the collected member and the arranged member to more accurately perform calibration processing.

An information processing method of the present disclosure is for use in a mounting device including a mounting head for collecting components and arranging the components on a board, the information processing method including: a step for performing detection processing of acquiring a captured image of a member having a straight line side, detecting multiple edge points with respect to the straight line side to obtain a proximal straight line of the side, and detecting an outer shape of the member by excluding edge points outside a predetermined range from the proximal straight line on an outside and an inside of the member.

With this method, similar to with the above information processing device, since the outer shape is detected by excluding an inappropriate edge points on the inside or the outside of the member, the outer shape of the member having a straight side on the outer circumference can be detected with higher accuracy. Note that, with this information processing method, various forms of the above information processing device may be employed, and items to perform each function of the above information processing device may be added.

INDUSTRIAL APPLICABILITY

An information processing device and mounting device of the present disclosure may be applied to a field of processing such as collecting and arranging components.

REFERENCE SIGNS LIST

10: mounting system;
11: mounting device;
12: board processing section;
14: component supply section;
16: component camera;
17: jig storage unit;
18: loading table;

20: mounting section;
21: head moving section;
22: mounting head;
23: suction nozzle;
24: mark camera;
30: control section;
31 CPU;
32: memory section;
35: management PC;
40: jig;
41: damage;
42: adhered matter;
43: dirt;
50: jig image;
51: damage image;
52: adhered matter image;
54: edge point;
55: approximated straight line;
P: component;
S: board

The invention claimed is:

1. A mounting device comprising:
a mounting head for collecting components and arranging components on a board;
an accuracy measurement jig including a straight line side and configured to be collected by the mounting head;
a first camera configured to capture a first image of the accuracy measurement jig held by the mounting head; and
processing circuitry configured to:
perform detection processing of the first image of the accuracy measurement jig,
detect multiple edge points with respect to the straight line side to obtain a proximal straight line of the straight line side,
determine a quantity of the edge points that deviate by a first predetermined range from the proximal straight line, and
determine that the accuracy measurement jig is usable for calibration when the quantity of the edge points that deviate is less than a second predetermined range.

2. The mounting device according to claim 1, wherein the processing circuitry is configured to notify an operator of confirmation processing of the accuracy measurement jig when the quantity of the edge points that deviate is outside the second predetermined range.

3. The mounting device according to claim 1, wherein the processing circuitry is configured to notify an operator of a process confirming adherence of matter to the accuracy measurement jig when the quantity of the edge points that deviate on an outside of the accuracy measurement jig is outside the second predetermined range.

4. The mounting device according to claim 1, wherein when the quantity of the edge points that deviate on an inside of the accuracy measurement jig is outside the second predetermined range, the processing circuitry is configured to notify an operator of a process confirming at least one of a defect of the accuracy measurement jig and matter adhering to the accuracy measurement jig.

5. The mounting device according to claim 1, wherein the processing circuitry is configured to obtain at least one of a deviation of a pickup position and a deviation of a rotation angle of the accuracy measurement jig at the mounting head.

6. The mounting device according to claim 1, further comprising:
a second camera configured to capture a second image of the accuracy measurement jig after the mounting head has arranged the accuracy measurement jig at a predetermined position, wherein
the processing circuitry is configured to
perform a first calibration processing to obtain at least one of a deviation of a pickup position and a deviation of a rotation angle of the accuracy measurement jig at the mounting head, and
perform a second calibration to arrange the accuracy measurement jig at the predetermined position, capture the second image of the accuracy measurement jig arranged at the predetermined position using the second camera, and obtain at least one of a deviation of the arrangement position and the deviation of the rotation angle of the accuracy measurement jig using the second image.

7. An information processing method for use in a mounting device including a mounting head for collecting components and arranging the components on a board, the information processing method comprising:
a
capturing with a camera an image of an accuracy measurement jig held by the mounting head, the accuracy measurement jig including a straight line side;
performing detection processing of the image of the accuracy measurement jig,
detecting multiple edge points with respect to the straight line side to obtain a proximal straight line of the straight line side,
determining a quantity of the edge points that deviate by a first predetermined range from the proximal straight line, and
determining that the accuracy measurement jig is usable for calibration when the quantity of the edge points that deviate is less than a second predetermined range.

* * * * *